United States Patent
Kim et al.

(10) Patent No.: US 8,462,534 B2
(45) Date of Patent: *Jun. 11, 2013

(54) MEMORY MODULE CUTTING OFF DM PAD LEAKAGE CURRENT

(75) Inventors: Seok-Il Kim, Seoul (KR); You-Keun Han, Yongin-si (KR); Seung-Jin Seo, Suwon-si (KR)

(73) Assignee: Samsung Electronics Co., Ltd., Suwon-si Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/430,860

(22) Filed: Mar. 27, 2012

(65) Prior Publication Data

US 2012/0182777 A1 Jul. 19, 2012

Related U.S. Application Data

(63) Continuation of application No. 12/693,010, filed on Jan. 25, 2010, now Pat. No. 8,159,853.

(30) Foreign Application Priority Data

Feb. 10, 2009 (KR) ........................ 10-2009-0010474

(51) Int. Cl.
*G11C 5/02* (2006.01)
(52) U.S. Cl.
USPC .............. 365/51; 365/227; 365/201; 365/193
(58) Field of Classification Search
None
See application file for complete search history.

(56) References Cited

U.S. PATENT DOCUMENTS

| | | | | |
|---|---|---|---|---|
| 7,180,338 B2 * | 2/2007 | Shau | | 327/112 |
| 7,598,762 B2 * | 10/2009 | Byun et al. | | 324/764.01 |
| 7,716,401 B2 * | 5/2010 | Lee | | 710/100 |
| 7,864,604 B2 * | 1/2011 | David | | 365/191 |
| 7,903,492 B2 | 3/2011 | Ide et al. | | |
| 7,915,912 B2 * | 3/2011 | Oh et al. | | 326/30 |
| 7,996,590 B2 * | 8/2011 | Lee | | 710/100 |
| 8,117,363 B2 * | 2/2012 | Lee | | 710/100 |
| 8,134,882 B2 * | 3/2012 | Dono | | 365/225.7 |
| 8,159,853 B2 * | 4/2012 | Kim et al. | | 365/51 |
| 2006/0085715 A1 | 4/2006 | Kim et al. | | |
| 2010/0124139 A1 | 5/2010 | Dono | | |
| 2011/0055671 A1 * | 3/2011 | Kim et al. | | 714/800 |

FOREIGN PATENT DOCUMENTS

| KR | 1020040092765 A | 11/2004 |
|---|---|---|
| KR | 1020060038629 A | 5/2006 |
| KR | 100744004 B1 | 7/2007 |

* cited by examiner

*Primary Examiner* — Viet Q Nguyen
(74) *Attorney, Agent, or Firm* — Volentine & Whitt, PLLC

(57) ABSTRACT

A memory module includes: an ODT circuit on a memory device and including pull-up and pull-down resistors connected between pull-up and pull-down transistors. A data masking (DM) pad is provided in a tap region of the module board. A current leakage monitoring unit is also provided and receives a ground state signal from the DM pad and a bit configuration signal from the memory device and disables the pull-up transistors to cut off a current path between the pull-up resistors of the ODT circuit and the DM pad during a ODT enable mode.

15 Claims, 5 Drawing Sheets

MEMORY MODULE CUTTING OFF DM PAD LEAKAGE CURRENT

CROSS-REFERENCE TO RELATED APPLICATION

This is a Continuation Application of U.S. application Ser. No. 12/693,010, filed Jan. 25, 2010, which U.S. non-provisional patent application issued as U.S. Pat. No. 8,159,853 on Apr. 17, 2012, and claims the benefit of Korean Patent Application 10-2009-0010474 filed on Feb. 10, 2009, the subject matter of which is hereby incorporated by reference.

BACKGROUND

The present inventive concept relates to memory modules, such as those commonly used in data processing apparatuses. More particularly, the inventive concept relates to memory modules capable of cutting off leakage current.

Various semiconductor devices, such as CPUs, memories, and gate arrays, implemented by integrated circuit chips are incorporated into various data processing apparatuses, such as portable personal computers, PDAs, servers, and workstations. These data processing apparatuses may be capable of operating in a sleep mode during which most of the internal circuitry is placed in a standby state in order to reduce power consumption.

Many main memories for data processing apparatuses are implemented with semiconductor memories, such as dynamic random access memories (DRAMs). Each memory cell in a DRAM is configured with an access transistor and a storage capacitor. In its operation, the DRAM may be characterized as a volatile memory device since stored data is lost in the absence of applied power. In order to maintain stored data, the DRAM must routinely perform a refresh operation.

One more specific type of SDRAM is the synchronous dynamic random access memory (SDRAM). Its operation is characterized by a three-stage pipe line that separately performs (1) input of a column address, (2) reading of data based on the address, and (3) output of the corresponding read data in synchronization with a clock signal.

Any attempt to significantly reduce the power consumption in contemporary consumer electronic products, and particularly battery powered, portable devices must address the issue of power consumption by constituent memory devices, such as the DRAM.

The incorporation of DRAMs into many data processing apparatuses is typically accomplished by means of the so-called "memory module". A memory module is any substrate with integrated circuits mounted thereon which generally allows functional data access and common physical incorporation of memory within a host device. As routinely implemented a memory module comprises a plurality of separately packaged integrated circuit (IC) devices and related components mechanically mounted on a printed circuit board (PCB). The plurality of IC devices are electrically connected to a main board or main panel via a plurality of conductive elements called "taps". In one configuration, a tap is formed by a connection pin to an IC device.

Servers are one type of data processing apparatus typically requiring a great deal of memory data storage capacity. Contemporary servers often incorporate one or more registered dual in-line memory modules (RDIMMs), one specific type of memory module, to provide the necessary memory capacity.

In general, a DRAM can process data during a period between reception of a column address and output of read data. In contrast, the SDRAM performs the same data processing function using the afore-mentioned three-stage pipe line, wherein each stage of the pipe line is executed synchronously with a clock signal. Thus, three clock cycles are required for initial data output after beginning operation, but thereafter data may be output for every clock cycle. As a result, it is possible to access data at relatively high speed, as compared with other types of memory.

Normally, the SDRAM processes data in synchronization with the rising edge of the clock signal. In contrast, so-called double data rate (DDR) clocking techniques have been applied to RDIMM data access operations, wherein both the rising and falling edges of a single clock signal are used to process data.

Within certain data processing apparatuses, a memory module including an x4 component may not use a data masking (DM) function due to existing error correction and/or detection (ECC) functionality. In such a case, the DM pin may be pulled down to VSS on the memory module PCB or otherwise grounded within the system. Therefore, when on die termination (ODT) is enabled, a DC current path is formed between a pull-up-side resistor of the DM pin and ground. Unfortunately, this configuration results in an unintended current flow.

Therefore, measures are required which can detect an x4 signal at the memory module component level in order to forcibly disable an ODT switch of the DM pin to cut off the resulting current path, thereby reducing power consumption otherwise occurring as a result of the DM pin configuration.

SUMMARY

Embodiments of the inventive concept provide a memory module for incorporation within a data processing apparatus that is capable of cutting-off leakage current.

Embodiments of the inventive concept also provide a memory module for incorporation within a data processing apparatus that is capable of detecting an x4 signal at the component level and forcibly disabling an ODT switch of a DM pin.

Embodiments of the inventive concept also provide a memory module for incorporation within a server that is capable of reducing power consumption related to a DM pin.

Embodiments of the inventive concept also provide a memory module capable of cutting off leakage current that flows to ground through a pull-up resistor of an ODT circuit in a memory module during an operating mode in which data masking is not used.

Embodiments of the inventive concept also provide a DRAM memory module capable of minimizing or reducing power consumption within a constituent data processing apparatus.

In one embodiment of the inventive concept, there is provided a memory module, comprising; an on die termination (ODT) circuit provided on a memory device mounted on a memory board of the memory module, wherein the ODT circuit comprises pull-up and pull-down resistors connected between pull-up and pull-down transistors, a data masking (DM) pad provided in a tap region of the module board, and a current leakage monitoring unit configured to receive a ground state signal from the DM pad and a bit configuration signal from the memory device, and disable the pull-up transistors to cut off a current path between the pull-up resistors and the DM pad during an ODT enable mode of the memory device.

In another embodiment of the inventive concept, there is provided a memory module comprising; an on die termination (ODT) circuit provided on a memory device mounted on a memory board of the memory module, wherein the ODT circuit comprises pull-up and pull-down resistors connected between pull-up and pull-down transistors, a data masking (DM) pad provided in a tap region of the module board and connected to a DM check line, and a current leakage monitoring unit configured to determine whether or not current flows through the DM pad when a bit configuration signal provided by the memory device indicates that a data masking function is not used, and upon determining that current is flowing through the DM pad the current leakage monitoring unit is further configured to forcibly disable an ODT enable signal enabling the pull-up transistors.

BRIEF DESCRIPTION OF THE DRAWINGS

The above and other features and advantages will become more apparent by describing in detail embodiments thereof with reference to the attached drawings in which.

DETAILED DESCRIPTION OF EMBODIMENTS

Figure 1:
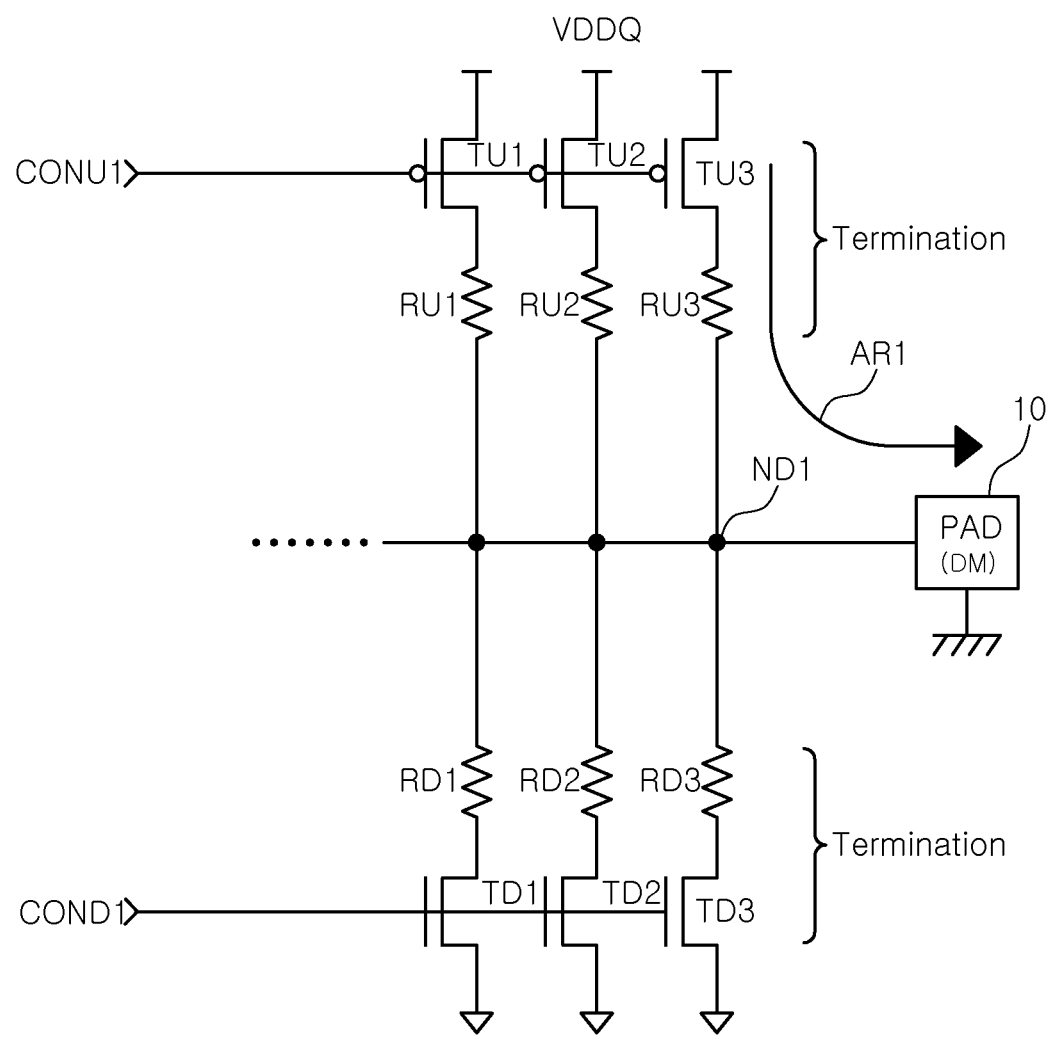
FIG. 1 is a circuit diagram illustrating an on die termination circuit for a semiconductor memory device.

Embodiments of the inventive concept will now be described more fully with reference to the accompanying drawings. However, it should be noted that the inventive concept may be variously embodied and should not be construed as being limited to only the illustrated embodiments.

Specific structural and functional details disclosed herein are merely representative for purposes of describing the illustrated embodiments. Accordingly, the illustrated embodiments are susceptible to various modifications and alternative implementations. It should be understood, however, that there is no intent to limit the scope of the inventive concept to only the illustrated embodiments in their particular forms. Rather, the inventive concept is intended to cover all modifications, equivalents, and alternatives falling within the scope of following claims. Throughout the written description and drawings, like reference numbers refer to like or similar elements.

It will be understood that, although the terms first, second and third may be used herein to describe various elements, these elements should not be limited by these terms. These terms are only used to distinguish one element from another. For example, a first element could be termed a second element, and, similarly, a second element could be termed a first element, without departing from the scope of illustrated embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Well understood semiconductor manufacturing processes, a basic data access operation, such as the refresh operation applied to a DRAM, as well as general internal circuits commonly used to accomplish DRAM operations, including on die termination circuits will not be described in detail for the sake of brevity and clarity.

Hereinafter, a memory module having a function cutting off a leakage current flowing to ground through a pull-up resistor of an on die termination circuit in a memory module operation mode in which a data masking function is not used according to an embodiment of the inventive concept will be described with reference to the accompanying drawings.

In order to highlight the novel teachings and resulting benefits afforded by the inventive concept, certain aspects of conventional memory modules will now be described with reference to FIGS. 1 through 4 as a teaching predicate.

FIG. 1 is a circuit diagram illustrating a conventional on die termination (ODT) circuit for a semiconductor memory device. Referring to FIG. 1, the ODT circuit provided in a semiconductor memory device comprises pull-up resistors RU1, RU2, and RU3 and pull-down resistors RD1, RD2, and RD3 connected between pull-up transistors TU1, TU2, and TU3 and pull-down transistors TD1, TD2, and TD3. A data masking pad 10 is connected to a connection node ND1 generally provided in a tap region of the constituent module board. That is, in the case of an x4-based module, the data masking pad 10 is connected to ground on the module board or a connected main board. In this case, the ODT is enabled, and an activated (e.g., a logically "high") ODT pull-up control signal CONU1 is applied. In response, the three pull-up transistors TU1, TU2, and TU3 are turned ON, and a current path represented by the arrow (AR1) is formed between the data masking pad 10 and the pull-up transistors TU1, TU2, and TU3 by the pull-up resistors RU1, RU2, and RU3. As a result, the current flowing to the data masking pad 10 via the pull-up resistors RU1, RU2, and RU3 leaks to ground. The term 'x4' in the foregoing discussion denotes a bit configuration signal for the semiconductor memory device.

Figure 2:
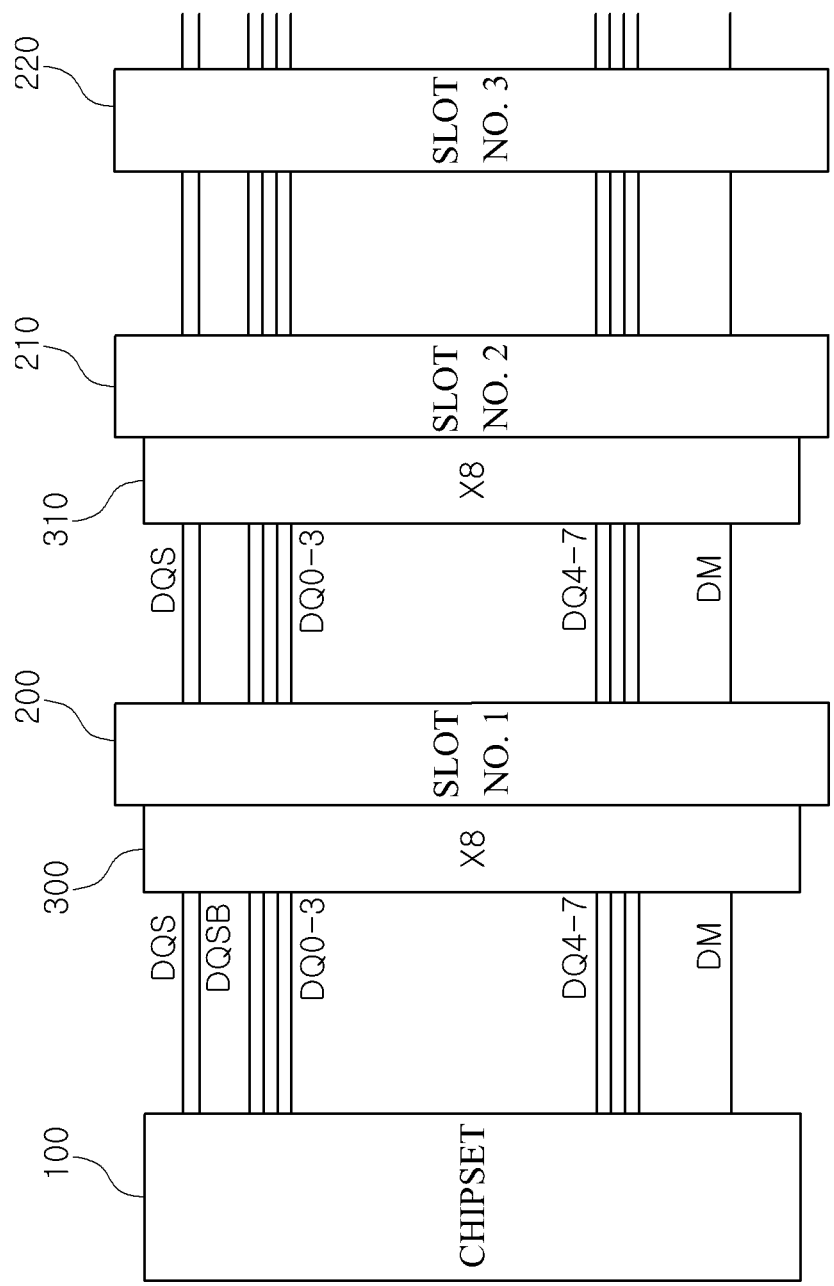
FIGS. 2, 3, and 4 are system block diagrams illustrating examples of leakage current arising from conventional memory modules.
Figure 3:
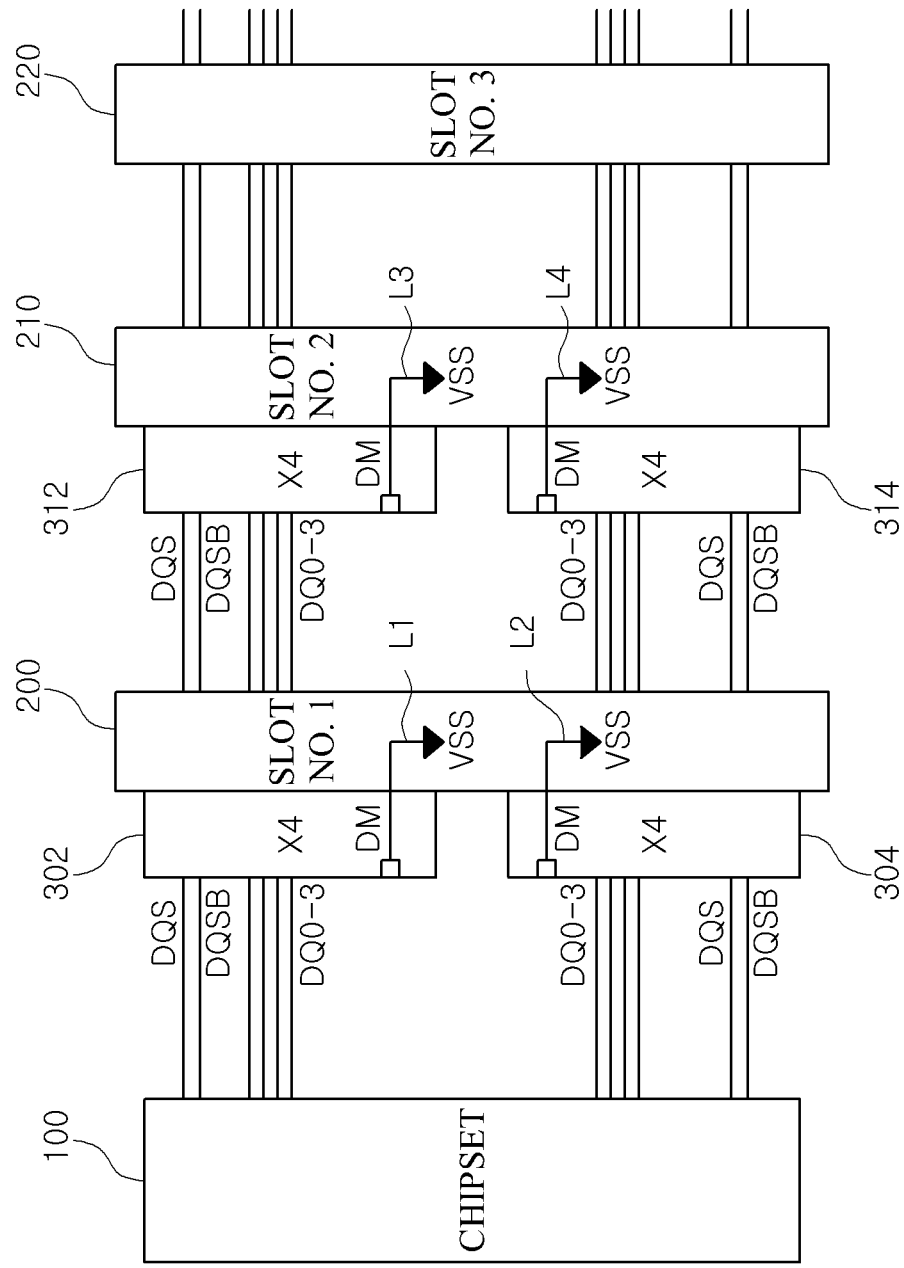
Figure 4:
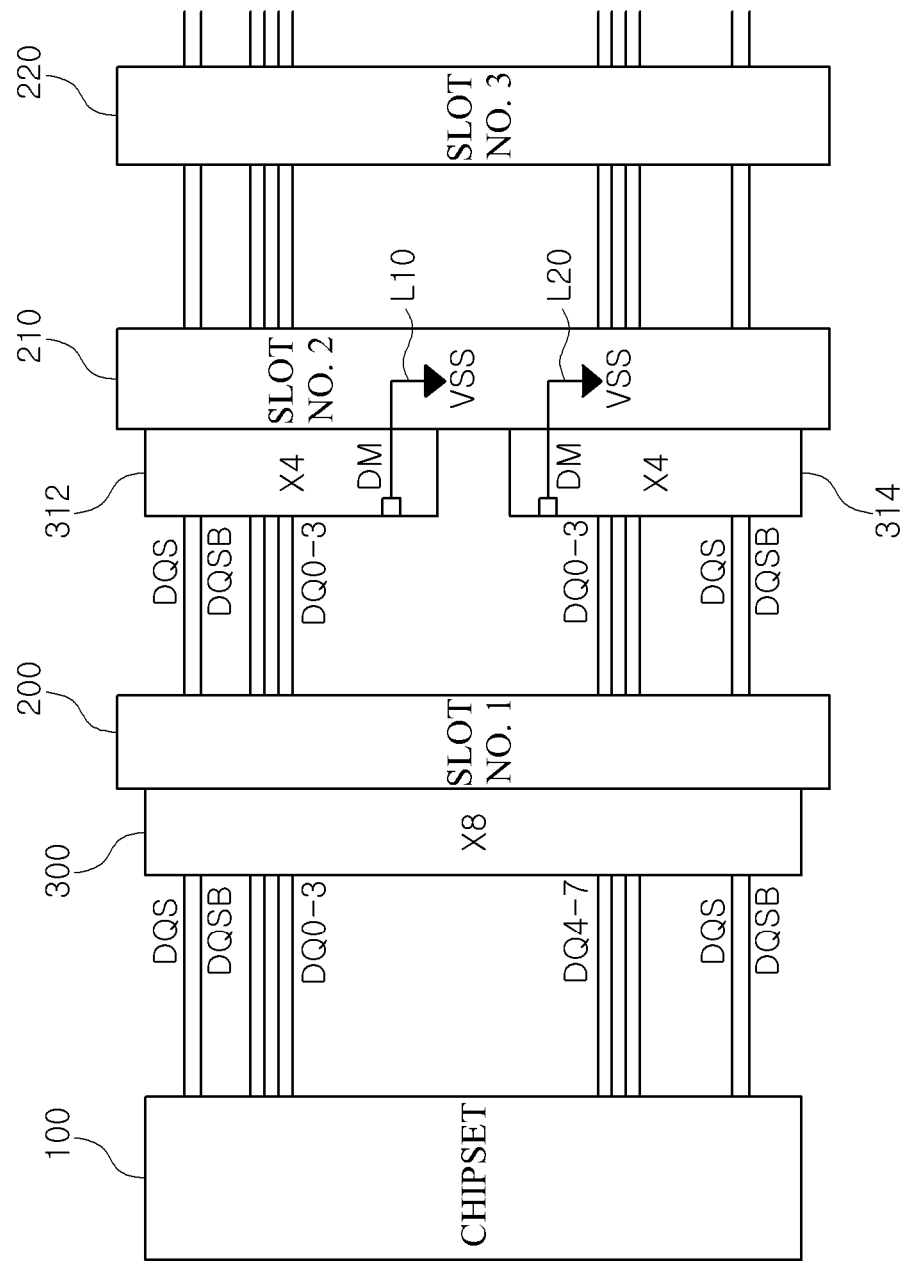

FIGS. 2, 3 and 4 are system block diagrams further illustrating additional examples of leakage current occurring in conventional memory modules of the type described above.

As described with reference to FIG. 1, the x4-based modules rarely use the data masking (DM) function. However, FIG. 2 shows an arrangement of non-ECC enabled x8 memory modules, wherein the non-ECC enabled x8 memory modules are capable of using the DM function.

Referring to FIG. 2, a first memory module 300 having a x8 bit configuration is connected to a first memory module slot 200, a second memory module 310 having an x8 bit configuration is connected to a second memory module slot 210, and DQS, DQSB, DQ0-7, and DM are connected as signal lines between a chipset controller 100 and the memory modules.

The system shown in FIG. 2, that is, the arrangement of non-ECC enabled x8 memory modules requires a total of eight (8) DQSs. More specifically, one DQS and one DM are required for each data byte (e.g., 8 bit bytes) being communicated within the system. All of the DQs and DQSs must be loaded at the same time to preserve signal integrity. Therefore, in the x8 configuration, one (1) DQS is required for every eight (8) DQs. In each non-ECC enabled x8 memory module, a total of eight (8) DQSs is required. Thus, in the illustrated conventional example, the DQ, DQS, and DM signals for each memory module slot are arranged in a one-for-one correspondence with all data bus lines. In addition, an ODT operation is enabled/disabled according to the configuration of the memory module slot and write/read operation for each rank. Therefore, within the arrangement shown in FIG. 2, constituent data masking pad(s) 10 (per FIG. 1) are not connected to the ground, in contrast to the connection configuration shown in FIG. 1. As a result, the issue of related leakage current need not be addressed.

However, the arrangement configurations shown in FIG. 3 or FIG. 4 are similar to that of FIG. 1 and the current leakage problem becomes as issue. Therefore, it is necessary to take some steps to prevent the current leakage.

Referring to FIG. 3, first and second memory modules 302 and 304 having a x4 bit configuration are connected to a first memory module slot 200, and third and fourth memory modules 312 and 314 also having a x4 bit configuration are connected to the second memory module slot 210. In addition, DQS, DQSB, DQ0-3, DQ0-3, DQS, and DQSB are connected as signal lines between the chipset controller 100 and the memory modules.

In the x4 configuration, in order to load DQ and DQS at the same time, one (1) DQS is required for every four (4) DQs. In an ECC enabled x4 memory module, a total of eighteen (18) DQS signals are required. In a system using a x72 ECC enabled memory module including eighteen (18) x4 components, since the ECC functionality implicates 64 bits, it is difficult to use the DM function. Therefore, a system supporting ECC enabled x4 memory modules will typically not need the DM function. In the design of the memory module substrates (e.g., respective PCBs) shown in FIG. 3, the DM pin on each memory module is pulled down to VSS via a respective ground line L1 through L4. Accordingly. in FIG. 3, the same current path described in relation to FIG. 1 is formed and leakage current flows to ground.

Referring to FIG. 4, a first memory module 300 having an x8 bit configuration is connected to a first memory module slot 200, and the second and third memory modules 312 and 314 having a x4 bit configuration are connected to a second memory module slot 210. DQS, DQSB, DQ0-7, DQS, and DQSB are connected as signal lines between the chipset controller 100 and the memory modules.

As shown in FIG. 4, in a system supporting both the x8 configuration and the x4 configuration, eighteen (18) DQSs are required for each memory module slot, where in the x8 configuration only nine DQSs are active. In this case, for the same reasons described with reference to FIG. 3, it is difficult to use the DM function. Accordingly, the DM pin of the x8 component is changed to a DQS pin (TDQS pin), and eight (8) DQs and two (2) DQSs are loaded at the same time. The DM pin of the x4 component, which is not necessary, is pulled down to VSS via a ground line L10 or L20.

Therefore, in the structure shown in FIG. 4, the same current path as that in FIG. 1 is formed and leakage current flows to ground.

Figure 5:
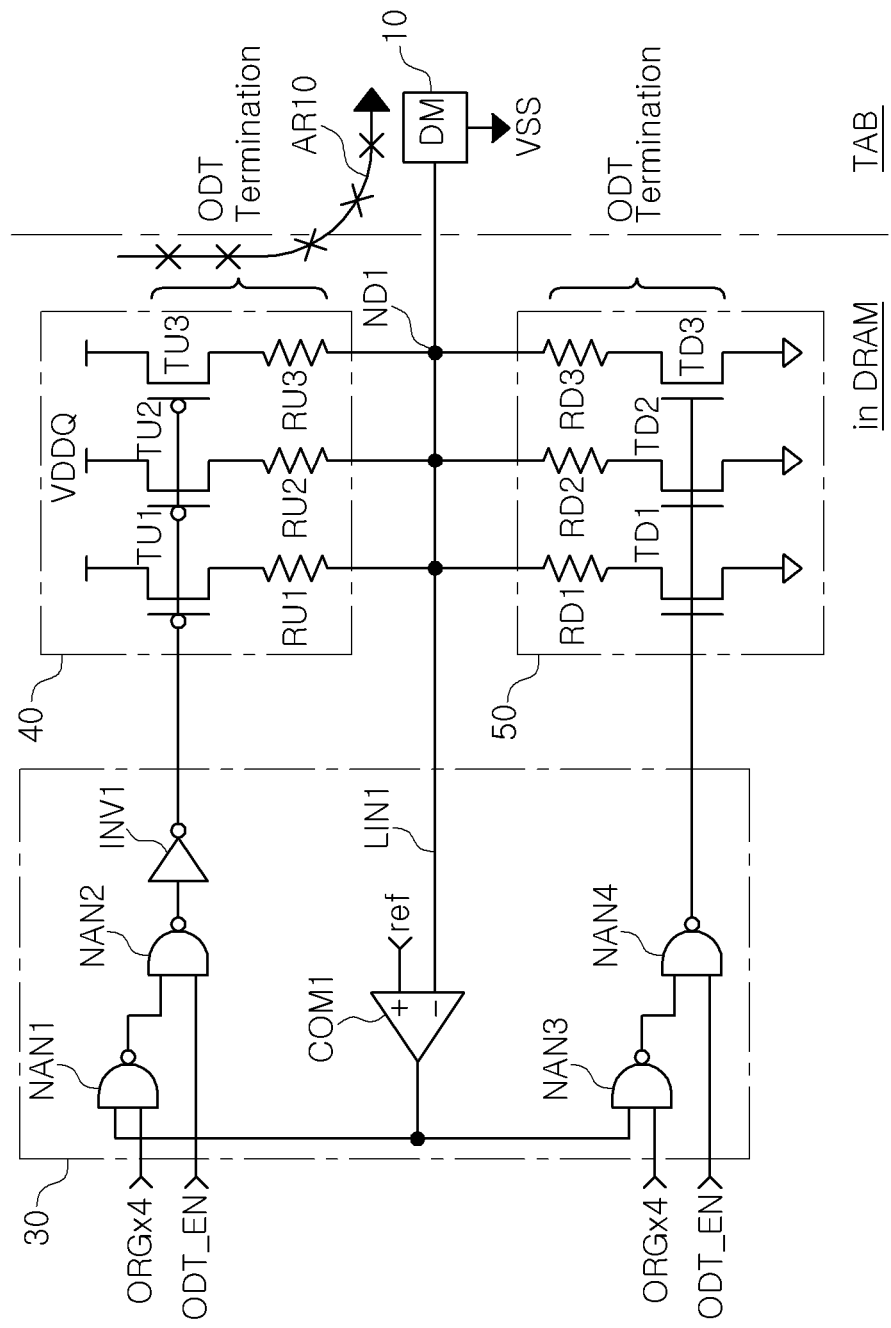
FIG. 5 is a circuit diagram illustrating an on die termination circuit having a current leakage monitoring unit according to an embodiment of the inventive concept.

In the embodiment of the inventive concept shown in FIG. 5, an ODT circuit is provided in a DRAM mounted on a memory module. For the reasons previously described, the data masking function is not used for the memory module, and according to the conventional design dictates, leakage current would flow to ground through the pull-up resistor when the ODT circuit is cut off.

However, FIG. 5 shows an ODT circuit including a current leakage monitoring unit 30 according to the embodiment of the inventive concept. The ODT circuit provided in a semiconductor memory device (e.g., a DRAM in the working example) includes a pull-up unit 40 arranged above a connection node ND1 and a pull-down unit 50 arranged below the connection node ND1. The pull-up unit 40 includes pull-up transistors TU1, TU2, and TU3 and pull-up resistors RU1, RU2, and RU3 connected between a power supply voltage terminal VDDQ and the connection node ND1. The pull-down unit 50 includes pull-down transistors TD1, TD2, and TD3 and pull-down resistors RD1, RD2, and RD3 connected between the connection node ND1 and a ground voltage VSS.

The data masking pad 10 connected to the connection node ND1 is provided in the tap region of the memory module board.

In an ODT enable (ODT_EN) mode, the current leakage monitoring unit 30 receives VSS (i.e., a ground state signal) for the data masking pad 10 and a bit configuration signal ORGx4 of the semiconductor memory device, disables the pull-up transistors TU1, TU2, and TU3, and cuts the current path between the pull-up resistors RU1, RU2, and RU3 of the ODT circuit and the data masking pad 10.

The ODT enable mode may be set by means of a conventionally provided mode register set (MRS) signal. When an ECC enabled x4 module is used, the data masking pad 10 may be grounded in the tap region of the memory module board or the main board of the data processing apparatus. The memory module including a plurality of ODT circuits shown in FIG. 5 may be provided in a registered dual in-line memory module (RDIMM).

In the illustrated embodiment of FIG. 5, the ODT enable mode is assumed to be set by a mode register set (MRS) signal. However, the ODT enable mode may be otherwise set by (e.g.,) an extended mode register set (EMRS) signal. For example, published U.S. Patent Application No. 2003/0056057 filed Mar. 20, 2003 discloses a technique that apples an EMRS command signal to adjust the refresh operation of a semiconductor memory in response to variations in temperature. This disclosure is hereby incorporated by reference and the application of the EMRS command may be similarly used in relation to embodiments of the inventive concept.

In FIG. 5, the specifically illustrated current leakage monitoring unit 30 comprises: a comparator COM1 comparing a reference voltage (ref) to the voltage apparent on a sensing line LIN1 and providing a comparison signal; a first NAND gate (NAN1) receiving the comparison signal and bit configuration signal ORGx4 from the semiconductor memory device and providing a first NAND response; a second NAND gate (NAN2) receiving the first NAND response from the first NAND gate (NAN1) and an ODT enable signal (ODT_EN) that enables the pull-up transistors TU1 to TU3 and generates a second NAND response; an inverter (INV1) inverting the second NAND response provided by the second NAND gate (NAN2); a third NAND gate (NAN3) receiving the comparison signal and the bit configuration signal ORGx4 and providing a third NAND response; and a fourth NAND gate (NAN4) receiving the third NAND response and the ODT enable signal (ODT_EN) that enables the pull-down transistors TD1 to TD3 and provide s fourth NAND response.

At the beginning of the host device (or memory system) operation, since the voltage apparent on the connection node ND1 is less than the reference voltage (ref), the output of the comparator COM1 will be high. Therefore, when the bit configuration signal ORGx4 is high, the output of the first NAND gate NAN1 is low. Therefore, the output of the second NAND gate NAN2 is high, and the output of the inverter INV1 is low. As a result, the pull-up transistors TU1 to TU3 are enabled. Therefore, the voltage apparent on the connection node ND1 increases. When this voltage level exceeds the reference voltage (ref), the output of the comparator COM1 transitions to low. Therefore, the output of the first NAND gate NAN1 is high, and the output of the second NAND gate NAN2 is low. And the output of the inverter INV1 becomes high. Therefore, the pull-up transistors TU1 to TU3 are disabled, and the current flowing to the data masking pad 10 is cut off.

That is, when the data masking function is not used, a signal line connected to the connection node ND1 (e.g., a DM check line (LIN1)) may be used to determine whether or not current flows through the data masking pad 10. When it is determined that current flows through the data masking pad 10, the ODT enable signal ODT_EN enables the pull-up transistors TU1 to TU3 to forcibly disable and completely cut off the current path between the pull-up resistors RU1 to RU3 of the ODT circuit and the data masking pad 10, as indicated by the crossed-out an arrow (AR10) in FIG. 5.

When the bit configuration signal ORGx4 is low, the operation of cutting-off the current path is halted, and the respective operation of the pull-up transistors TU1 and TU3 and the pull-down transistors TD1 to TD3 is again controlled by the previously described general operating mode.

Each one of a plurality of DRAMs functionally assembled on a memory module may include four (4) or eight (8) banks, for example. In certain embodiments of the inventive concept, a single bank may provide a data storage capacity of 16 Mb (megabits), 32 Mb, 64 Mb, 128 Mb, 256 Mb, 512 Mb, or 1024 Mb.

In the above-described embodiment of the inventive concept, the current leakage monitoring unit 30 comprises the comparator COM1, NAND gates NAN1 through NAN4, and the inverter INV1. However, the current leakage monitoring unit 30 may be otherwise implemented, as will be appreciated by those skilled in the art. In addition, an electrical fuse or anti-fuse may be used to cut off the flow of a current via the data masking pad 10, such that processing may be performed at the memory module level without unnecessary current consumption.

While the foregoing embodiments of the inventive concept have been shown and described with reference to the drawings, it will be understood by one of ordinary skill in the art that various changes in form and details may be made therein without departing from the scope of the inventive concept as defined by the following claims. For example, the detailed structure of the memory board or the arrangement or connection structure of the stub resistors may be changed without departing from the scope of the inventive concept.

In the above-mentioned example embodiment, the DRAM module has been described as an example. However, the technical spirit of the inventive concept can be applied to other volatile memories, such as a pseudo SRAM, or non-volatile memories.

What is claimed is:

1. A memory module, comprising:
    an on die termination (ODT) circuit provided on a memory device mounted on the memory module, wherein the ODT circuit comprises a pull-up resistor, a pull-down resistor, a pull-up transistor and a pull-down transistor;
    a data masking (DM) pad provided in the memory module; and
    a current leakage monitoring unit configured to receive a ground state signal from the DM pad and a bit configuration signal from the memory device, and disable the pull-up transistor to cut off a current path between the pull-up resistor and the DM pad during an ODT enable mode of the memory device.

2. The memory module of claim 1, wherein the ODT enable mode is set by a mode register set (MRS) signal.

3. The memory module of claim 1, wherein the memory module is an error correction/detection (ECC) enabled x4 module and the DM pad is grounded within a tap region of the memory module.

4. The memory module of claim 1, wherein the memory module is an ECC enabled x4 module and the DM pad is grounded to a mother board of a data processing apparatus incorporating the memory module.

5. A memory module, comprising:
    an on die termination (ODT) circuit provided on a memory device mounted on the memory module, wherein the ODT circuit comprises pull-up and pull-down resistors connected between pull-up and pull-down transistors;
    a plurality of pads including a data input/output (DQ) pad, a data strobe (DQS) pad and a data masking (DM) pad provided in the memory module; and
    a current leakage monitoring unit configured to receive a ground state signal from the DM pad and a bit configuration signal from the memory device, and disable the pull-up transistors to cut off a current path between the pull-up resistors and the DM pad during an ODT enable mode of the memory device,
    wherein the current leakage monitoring unit cuts off the current path between the pull-up resistors and the DM pad independently of the DQ pad and the DQS pad.

6. The memory module of claim 5, wherein the ODT enable mode is set by a mode register set (MRS) signal.

7. The memory module of claim 6, wherein the current leakage monitoring unit disables the pull-up transistors when a voltage level of the ground state signal is higher than a reference voltage level during an ODT enable mode of the memory device.

8. The memory module of claim 5, wherein the memory module is an error correction/detection (ECC) enabled x4 module and the DM pad is grounded within the tap region of the memory module.

9. The memory module of claim 6, wherein the memory module is an ECC enabled x4 module and the DM pad is grounded to a mother board of a data processing apparatus incorporating the memory module.

10. A memory device, comprising:
an on die termination (ODT) circuit provided on the memory device:
wherein the ODT circuit comprises a pull-up resistor, a pull-down resistor, a pull-up transistor and a pull-down transistor;
a data masking (DM) pad provided in the memory device and coupled to the ODT circuit; and
a current leakage cutoff unit configured to disable at least one of the pull-up transistor or the pull-down transistor to cut off the current leakage via the DM pad when the DM pad connected to a ground voltage during a ODT enable mode.

11. The memory device of claim 10, wherein the current leakage cutoff unit is a fuse.

12. The memory device of claim 11, wherein the fuse is an electrical fuse or an anti-fuse.

13. The memory device of claim 10, wherein the ODT enable mode is set by a mode register set (MRS) signal.

14. The memory device of claim 10, wherein the memory device mounted on an error correction/detection (ECC) enabled x4 memory module.

15. The memory module of claim 10, wherein the memory module is a registered dual in-line memory module (RDIMM).

* * * * *